United States Patent
Raghunathan et al.

(10) Patent No.: US 7,880,554 B2
(45) Date of Patent: Feb. 1, 2011

(54) PERIODIC TIMING JITTER REDUCTION IN OSCILLATORY SYSTEMS

(75) Inventors: Ashwin Raghunathan, Santa Clara, CA (US); Marzio Pedrali-Noy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 11 days.

(21) Appl. No.: 12/432,515

(22) Filed: Apr. 29, 2009

(65) Prior Publication Data

US 2010/0194471 A1  Aug. 5, 2010

Related U.S. Application Data

(60) Provisional application No. 61/149,421, filed on Feb. 3, 2009.

(51) Int. Cl.
  *H03L 1/00* (2006.01)
  *G05F 1/10* (2006.01)
(52) U.S. Cl. .................. 331/186; 323/282; 327/540
(58) Field of Classification Search ............. 331/185, 331/186; 323/282, 283; 327/530, 535, 538, 327/540; 713/322
See application file for complete search history.

(56) References Cited

U.S. PATENT DOCUMENTS 7,126,433 B2 * 10/2006 Godambe et al. ............. 331/74
7,205,829 B2 *  4/2007 Herbert et al. ............. 327/540
7,688,150 B2 *  3/2010 Kurd et al. ................. 331/44
2005/0127887 A1   6/2005 Kozaki
2009/0261890 A1 * 10/2009 Fifield et al. .............. 327/536

OTHER PUBLICATIONS

Gupta, V.; Rincon-Mora, G.A.; Raha, P., "Analysis and design of monolithic, high PSR, linear regulators for SoC applications", Georgia Tech Analog and Power IC Design Lab, Georgia Institute of Technology, Texas Instruments, Inc., SOC Conference, 2004, Proceedings, IEEE Xplore, IEEE International, pp. 311-315, 12-15, Sep. 2004.

(Continued)

*Primary Examiner*—Robert Pascal
*Assistant Examiner*—Levi Gannon
(74) *Attorney, Agent, or Firm*—Jiayu Xu (57) ABSTRACT

A device including a voltage regulator with an adaptive switching frequency circuit for noise-sensitive analog circuits, such as oscillatory systems with phase-lock loops (PLLs) and voltage-controlled oscillators (VCOs) is described. In an exemplary embodiment, the device includes a reference clock oscillator, a low-jitter oscillator, a power supply including a clock signal input to regulate a power supply voltage for the low-jitter oscillator, a clock detector to generate a clock detector control signal when the low-jitter oscillator output frequency is stable, and a multiplexer to select between a reference clock oscillator output signal and a low-jitter oscillator output signal as the clock signal input to the power supply to mitigate effects of period jitter in the low-jitter oscillator output signal when the clock detector control signal is asserted. In a further exemplary embodiment, a clock detector control signal is configured to control the multiplexer to select the low-jitter oscillator output signal as the clock signal input to the power supply when the low-jitter oscillator output frequency is stable.

32 Claims, 8 Drawing Sheets

OTHER PUBLICATIONS

Ingino, J.M.; von Kaenel, V.R., "A 4-GHz clock system for a high-performance system-on-a-chip design", IEEE Journal of Solid-State Circuits, vol. 36, No. 11, pp. 1693-1698, Nov. 2001.

Chang-Hyeon Lee; McClellan, K.; Choma, J., Jr., "A supply-noise-insensitive CMOS PLL with a voltage regulator using DC-DC capacitive converter", IEEE Journal of Solid-State Circuits, vol. 36, No. 10, pp. 1453-1463, Oct. 2001.

Gupta, V.; Rincon-Mora, G.A., "A 5mA 0.6um CMOS Miller-Compensated LDO Regulator with -27dB Worst-Case Power-Supply Rejection Using 60pF of On-Chip Capacitance", 2007 IEEE Solid-State Circuits Conference, ISSCC 2007, Digest of Technical Papers. IEEE International, pp. 520-521, 11-15, Feb. 14, 2007.

Hajimiri, A.; Lee, T.H., "A general theory of phase noise in electrical oscillators" IEEE Journal of Solid-State Circuits, vol. 33, No. 2, pp. 179-194, Feb. 1998.

International Search Report and Written Opinion - PCT/US10/023011, International Search Authority - European Patent Office, May 7, 2010.

* cited by examiner

FIG. 8

PERIODIC TIMING JITTER REDUCTION IN OSCILLATORY SYSTEMS

CLAIM OF PRIORITY UNDER 35 U.S.C. §119

The present Application for Patent claims priority to Provisional Application No. 61/149,421 entitled "Periodic Timing Jitter Reduction In Digital Clock Generators" filed Feb. 3, 2009, and assigned to the assignee hereof and hereby expressly incorporated by reference herein.

TECHNICAL FIELD

The present disclosure relates generally to the field of integrated circuits (ICs), and more specifically to voltage regulators for noise-sensitive integrated circuits (ICs), such as phase-lock loops (PLLs), voltage-controlled oscillators (VCOs), and other low-jitter oscillatory systems utilized for clock generation in digital processors or frequency synthesis in analog and radio frequency (RF) circuits.

BACKGROUND

High-speed digital logic circuits rely on digital clock signals with low timing uncertainty or jitter (both deterministic and random). Generally, digital clock signals are generated by a clock generator including a phase-locked loop (PLL) and voltage (or current) controlled oscillator (VCO). The PLL output includes a phase and frequency which is used to lock the VCO to a low-jitter external reference oscillator clock signal (reference clock source). One of the main contributors to digital clock jitter in such a clock generator is noise on the power supply voltage signal to the PLL and VCO. A dedicated or "clean" power supply voltage signal is not always available. The PLL and VCO may be forced to share a common power supply voltage signal with other logic blocks that inject digital switching activity (noise) into the common power supply voltage signal.

In the absence of a dedicated "clean" power supply voltage input to a PLL-VCO based clock generator, it is highly desirable to generate a "clean" power supply voltage signal. One technique is to filter and/or voltage regulate an existing noisy power supply voltage signal using a low dropout voltage regulator (LDO). The output of the LDO is used to power the VCO and PLL in the clock generator, as these circuit blocks are particularly sensitive to power supply voltage noise. There are several known LDO implementations suitable for PLL-VCO clock generator applications. These typically involve using one or more voltage regulator stages to reduce noise coupling.

Traditionally, integrated circuits (ICs) incorporating an on-chip PLL and VCO use independent power-supply bumps to achieve a clean power supply connection. The number of power-supply bumps and silicon die bond pads increases as multiple PLLs and VCOs are incorporated into the IC. The power-supply bumps refer to a solder ball connection between a packaged IC and the main application circuit board. By incorporating LDOs on an IC in order to support applications requiring low jitter, the number of power-supply and ground connections can be minimized, thereby reducing the packaged IC pin count, chip and main application circuit board routing complexity.

Figure 1:
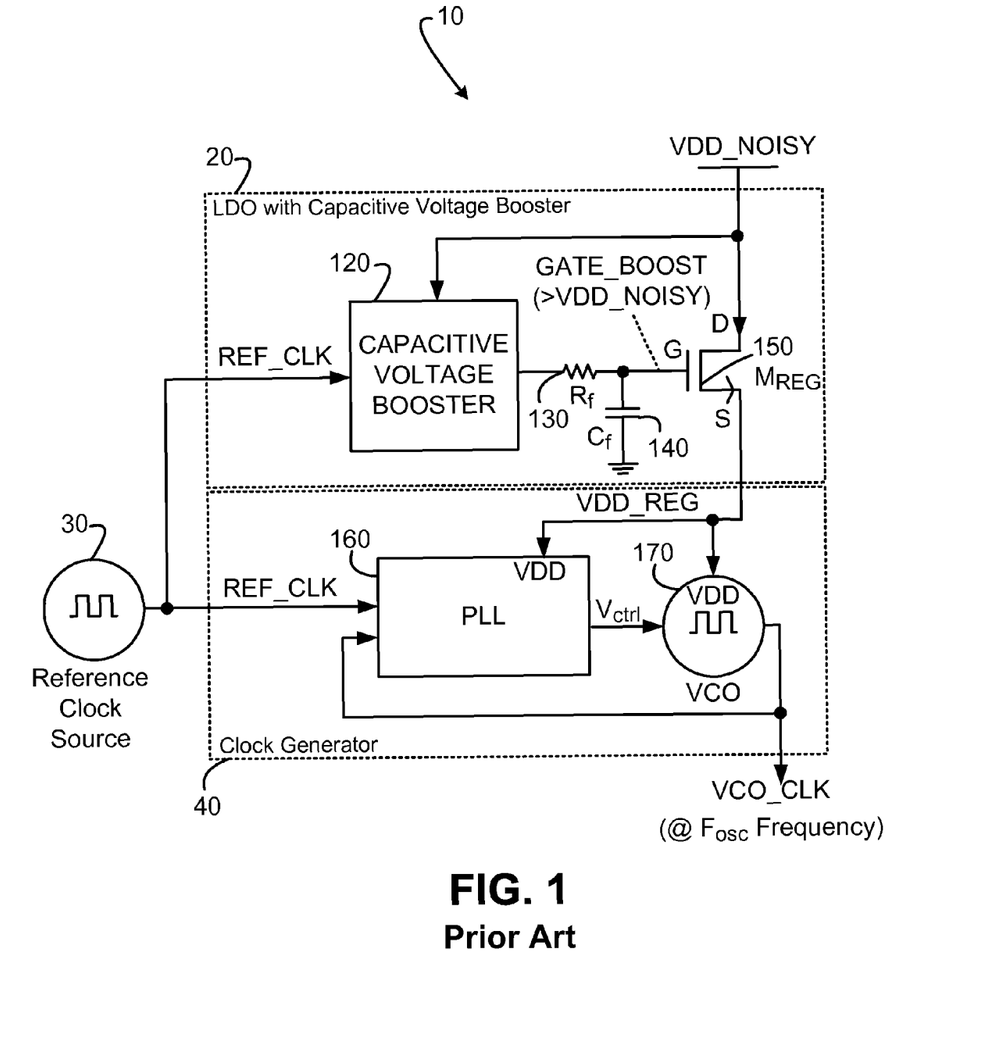
FIG. 1 shows a schematic diagram of a conventional oscillatory system.

FIG. 1 shows a schematic diagram of a conventional oscillatory system 10. Oscillatory system 10 includes LDO 20, reference clock source 30, and PLL-VCO clock generator 40. LDO 20 further includes capacitive voltage booster 120 for powering PLL-VCO clock generator 40. LDO 20 regulates an input voltage, VDD_NOISY, to generate a "clean" regulated output voltage (first input bias voltage), VDD_REG, into PLL-VCO clock generator 40. VDD_REG feeds into noise sensitive PLL 160 and VCO 170 contained within PLL_VCO clock generator 40. PLL_VCO clock generator 40 also receives reference clock, REF_CLK, from reference clock oscillator 30. Reference clock oscillator 30 provides a stable clock source to lock the output of VCO 170 to a desired output signal, VCO_CLK, which in the example figure is at frequency, $F_{osc}$.

Referring to FIG. 1, PLL 160 compares input clocks, REF_CLK and VCO_CLK to generate voltage control signal, Vctrl, which operates to phase-frequency lock VCO 170. There are other known implementations for constructing PLL 160 depending on required frequency resolution (frequency step-size) for oscillatory system 10 as well as the operating frequency range (low-speed digital, high-speed digital, or radio frequency, and the like).

Capacitive voltage booster 120 is in series with a RC low-pass filter (comprised of resistor $R_f$ 130 and capacitor $C_f$ 140) to generate a signal, GATE_BOOST, which voltage level is higher than that of VDD_NOISY. GATE_BOOST biases the gate of a source-follower voltage regulator comprised of NMOS transistor 150. Here, GATE_BOOST must be higher than VDD_NOISY to ensure NMOS transistor 150 is in saturation while maintaining a low voltage drop between the input VDD_NOISY and an output signal of LDO 20, VDD_REG.

Configured this way, LDO 20 provides reasonable noise isolation between VDD_NOISY and VDD_REG across a wide frequency range. However, GATE_BOOST (ideally a DC voltage) also has an AC voltage component or "ripple" which is an artifact of the switching activity (clocked by REF_CLK in this instance) generated by capacitive voltage booster 120. Large component values for resistor $R_f$ 130 and capacitor $C_f$ 140 (RC filtering) are typically used to minimize the AC voltage component of GATE_BOOST before applying it to the gate of NMOS transistor 150. Any voltage fluctuations at the gate of NMOS transistor 150 tend to appear at the source node, which corresponds to signal, VDD_REG, into PLL 160 and VCO 170.

Although LDO 20 isolates VDD_NOISY from VDD_REG, VDD_REG includes a voltage ripple component from REF_CLK which is input into capacitive voltage booster 120. This voltage ripple component injects noise into VCO 170 output clock signal, VCO_CLK. In this instance, VCO_CLK shows deterministic jitter in the time domain or spurs (at intervals of $F_{REF\_CLK}$) in the frequency domain. Both effects are undesirable depending upon the target application. One option is to replace LDO 20 with a switching voltage regulator; however, a voltage ripple component is again introduced resulting in deterministic jitter at VCO_CLK.

For applications requiring low oscillator phase noise, such as (i) many analog and radio frequency oscillatory systems, particularly in high-speed digital designs (multi-GHz CPUs, digital communication links, and the like) as well as (ii) radio frequency and analog frequency synthesizer designs (transmitters, receivers, signal generators, and the like), improved low jitter oscillatory systems are desired.

The appended drawings illustrate exemplary configurations of the disclosure and, as such, should not be considered as limiting the scope of the disclosure that may admit to other equally effective configurations. Correspondingly, it has been contemplated that features of some configurations may be beneficially incorporated in other configurations without further recitation.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 2:
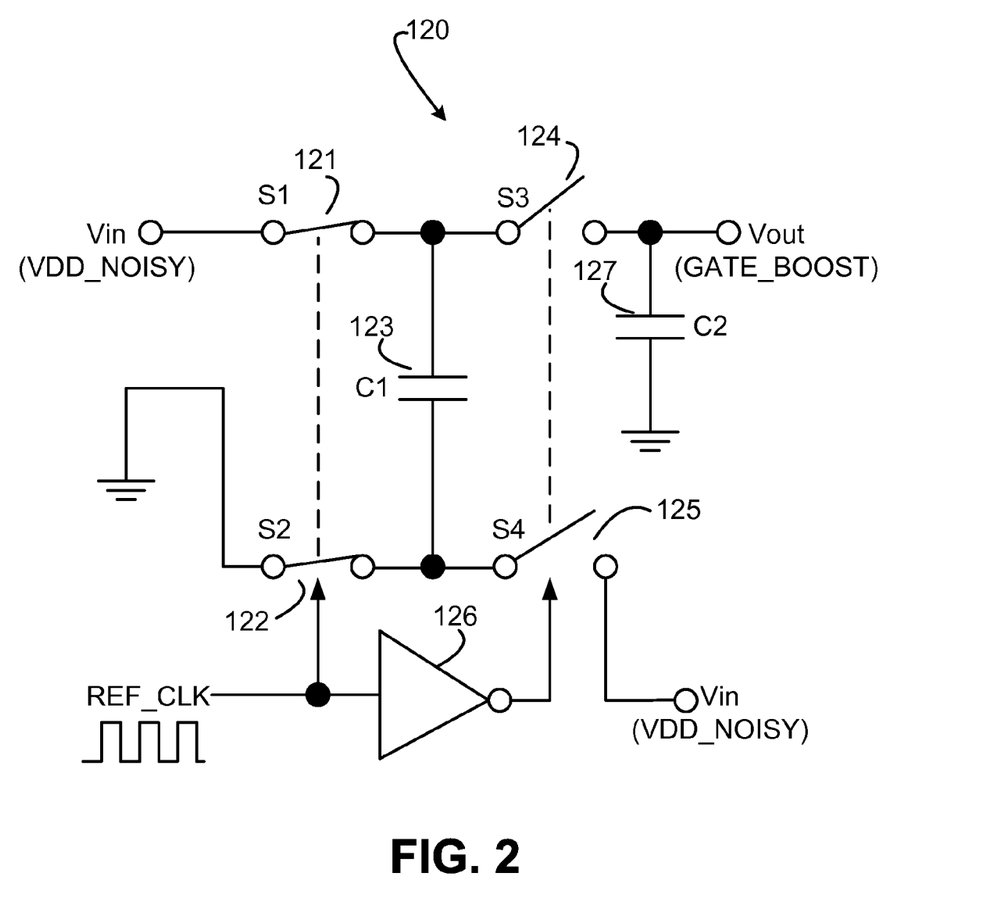
FIG. 2 shows a schematic diagram of a capacitor voltage booster for use with the oscillatory system of FIG. 1 in accordance with an exemplary embodiment.

FIG. 2 shows a schematic diagram of a capacitor voltage booster 120 for use with the oscillatory system 10 in FIG. 1.

Capacitor voltage booster 120 includes charge transfer switches S1 121, S2 122, S3 124, and S4 125. Capacitor voltage booster 120 functions as a charge pump to double the voltage applied at Vin (Vout=2*Vin). In this example, Vin=VDD_NOISY and Vout=GATE_BOOST. During a first half-cycle of REF_CLK (REF_CLK=1), charge transfer switches S1 121 and S2 122 are closed, charge transfer switches S3 124 and S4 125 are open, and capacitor C1 123 charges to Vin (VDD_NOISY=Vin). During a second half-cycle of REF_CLK (REF_CLK=0), charge transfer switches S1 121 and S2 122 are open, charge transfer switches S3 124 and S4 125 are closed, and capacitor C1 123 is level shifted upward by Vin volts (VDD_NOISY=Vin). During the second half-cycle of REF_CLK (REF_CLK=0), capacitor C1 123 connects to the reservoir capacitor C2 127, allowing charge to be delivered to the output voltage, Vout (GATE_BOOST), as needed.

The actual output voltage, Vout (GATE_BOOST), is slightly lower than 2*Vin since charge transfer switches S1 121, S2 122, S3 124, and S4 125 have series resistance and any load current on Vout (GATE_BOOST) drains charge from reservoir capacitor C2 127. Implemented in oscillatory system 10 of FIG. 1, the load current is very small when GATE_BOOST drives the gate of NMOS transistor 150.

The ripple in output voltage (Vout=GATE_BOOST) is proportional to the series resistance (Rs) of charge transfer switches S1 121, S2 122, S3 124, and S4 125 and the load current measured at the output (Iout) and can be expressed with an equation, Vripple=Iout*Rs. The ripple frequency is equal to the input clock REF_CLK frequency, FCLK, to the capacitor voltage booster 120.

An important factor to consider in the operation of capacitive voltage booster 120 is power conversion loss—Power Loss between Vin (VDD_NOISY) and Vout (GATE_BOOST). It is well known in the art that power loss can be express as follows:

$$\text{Power Loss} = \frac{1}{2} * \begin{bmatrix} C1*(4Vin^2 - Vout^2) + \\ C2*(2Vout*Vripple - Vripple^2) \end{bmatrix} * FCLK,$$

where

FCLK is the input clock frequency in Hz

As is evident in the power loss equation shown above, the power loss may be minimized with a small Vripple and minimal drop in output voltage. However, the power loss is also proportional to FCLK and any increase in FCLK will always increase the power loss of capacitive voltage booster 120. The voltage ripple and power loss properties of capacitive voltage booster 120 will be described in further detail. Other configurations for capacitor voltage booster 120 are known and the configuration depends on requirements for the target application in terms of GATE_BOOST DC voltage, GATE_BOOST load current, GATE_BOOST AC ripple, input clock frequency range, among other criteria.

Figure 3:
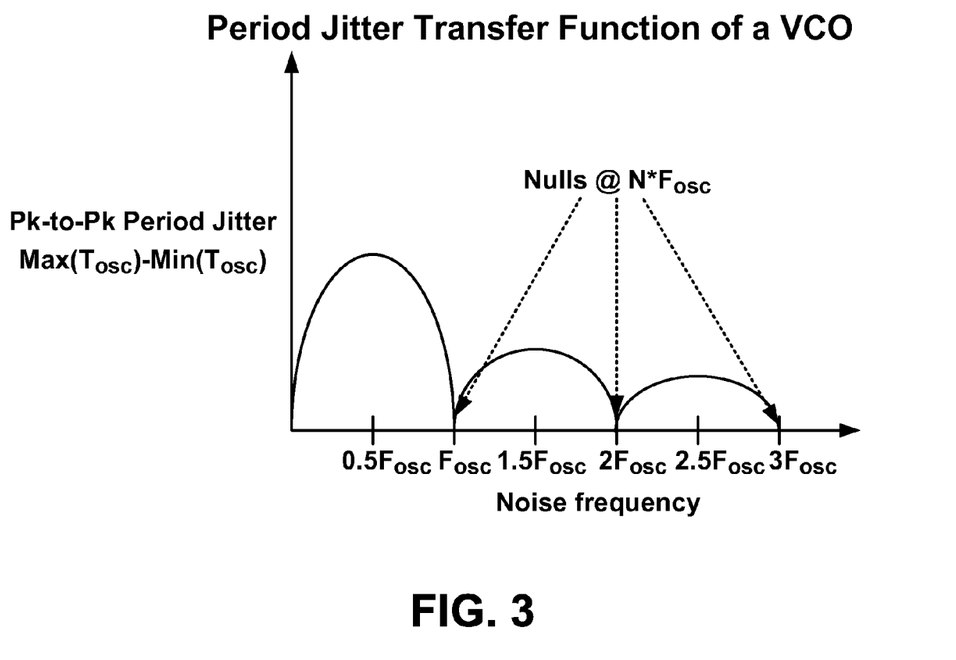
FIG. 3 graphically depicts the period jitter transfer function of a VCO as a function of noise frequency present on VDD_REG for the oscillatory system in FIG. 1.

FIG. 3 graphically depicts the period jitter transfer function of a VCO as a function of noise frequency present on VDD_REG for the oscillatory system in FIG. 1.

In the ideal situation with no noise present on VDD_REG, clock generator 40 utilizes voltage-controlled oscillator (VCO 170) to generate output signal, VCO_CLK, with a frequency of $F_{osc}$ (in Hz), that is solely determined by input control voltage, $V_{ctrl}$, to VCO 170. In practice with noise present on VDD_REG, $F_{osc}$ is a function of the supply voltage (VDD_REG) and substrate voltages (GND) as well as other bias voltages (not shown in FIG. 1).

VCO 170 can be modeled as a linear time-variant (LTV) circuit that converts voltage variations in VDD_REG and $V_{ctrl}$ into phase variations which translate into VCO_CLK output jitter in the time domain or phase noise in the frequency domain. The mathematics behind this model of VCO 170 behavior is well known in the art. The model of VCO 170 can be extended to show that the period jitter transfer function of VCO 170 (measured at VCO_CLK output) exhibits nulls at multiples of the oscillation frequency, $F_{osc}$. In other words, VCO 170 (and VCO_CLK output) is insensitive to injected noise into either $V_{ctrl}$ or VDD_REG when the noise frequency is an integer multiple of the oscillation frequency, $F_{osc}$. At all other frequencies, the noise frequency impacts the measured period jitter of VCO 170 (and VCO_CLK output). This mathematical property is exploited in the exemplary embodiment shown and described below.

Figure 4:
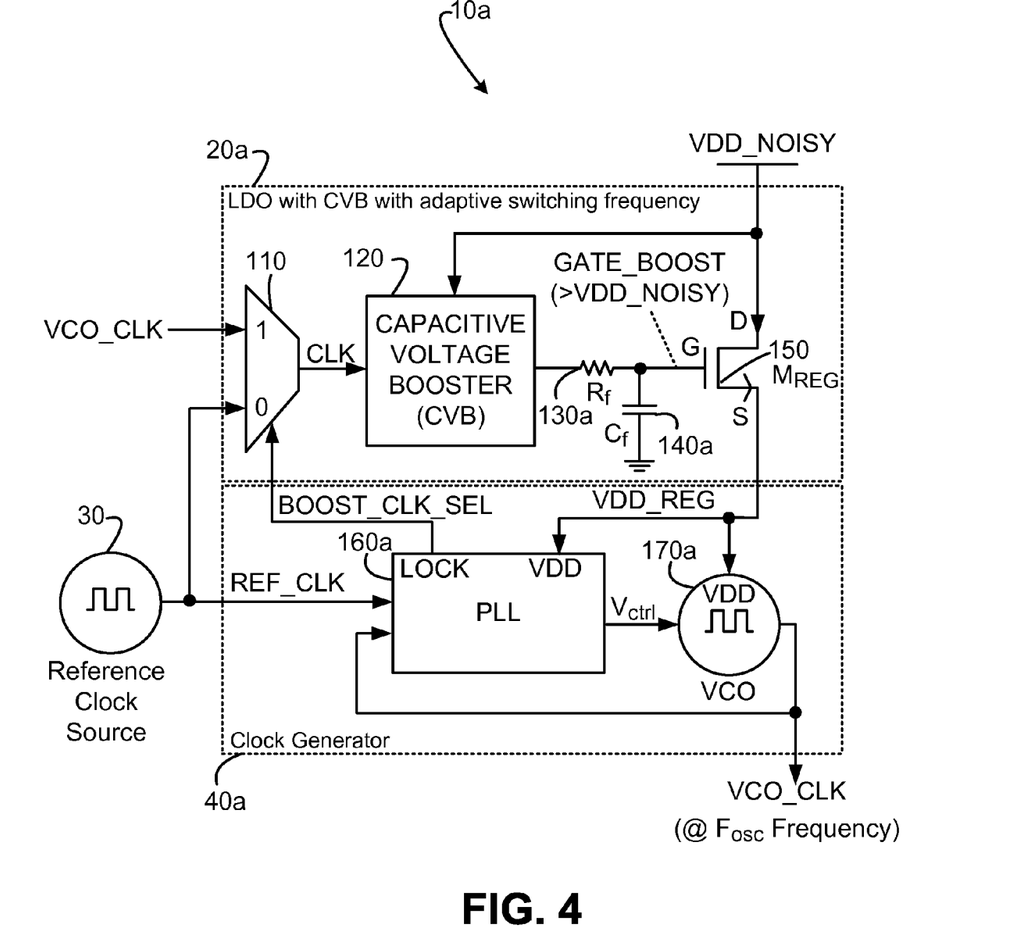
FIG. 4 shows a schematic diagram of an oscillatory system with a LDO, PLL, and VCO in accordance with an exemplary embodiment.

FIG. 4 shows a schematic diagram of an oscillatory system 10*a* including an LDO, PLL, and VCO in accordance with an exemplary embodiment. Within oscillatory system 10*a*, LDO 20*a* regulates VDD_NOISY input voltage to generate a "clean" regulated output voltage, VDD_REG for clock generator 40*a*. VDD_REG is connected to noise sensitive PLL 160*a* and VCO 170*a* contained within clock generator 40*a*.

As similarly described in connection with prior art FIG. 1 and in particular for PLL 160, PLL 160*a* is a phase-locked loop that compares input clocks, REF_CLK and VCO_CLK and generates a Vctrl signal for phase-frequency locking VCO 170*a*. There are many possible implementations for PLL 160*a* depending on required frequency resolution (frequency step-size) for oscillatory system 10*a* as well as the operating frequency range (low-speed digital, high-speed digital, or radio frequency, and the like).

In the exemplary embodiment of oscillator system 10*a*, LDO 20*a* further includes a multiplexer (MUX) 110 for selecting a clock signal input, CLK, for capacitive voltage booster 120, which corresponds to the system of FIG. 2. At oscillatory system 10*a* startup (power-on), the REF_CLK signal connects to the clock signal input, CLK, via MUX 110 and control signal BOOST_CLK_SEL (low when PLL 160*a* LOCK signal is low). In this instance, PLL 160*a* has not locked VCO_CLK to REF_CLK, and both the PLL 160*a* LOCK signal and BOOST_CLK_SEL signal are active low. Once PLL 160*a* has locked VCO_CLK to REF_CLK, both the PLL 160*a* LOCK signal and BOOST_CLK_SEL are active high. Once BOOST_CLK_SEL is active high, VCO_CLK signal connects to the clock signal input, CLK via MUX 110.

A key advantage of LDO 20*a* and clock generator 40*a* over LDO 20 and clock generator 40 (from FIG. 1) is the adaptive switching frequency for the clock input to the capacitive voltage booster 120. In the oscillatory system 10*a* of FIG. 4, the GATE_BOOST signal AC voltage component is still present (as described in reference to FIG. 1), but the switching frequency is changed to the VCO_CLK signal frequency, $F_{osc}$, when PLL 160*a* is locked VCO_CLK to REF_CLK. Therefore, as can be seen from FIG. 3, the period jitter is zero (for VCO 170*a* and VCO_CLK output signal) when the noise frequency is equal to $F_{osc}$.

Because the switching frequency, CLK, for capacitive voltage booster 120 is equal to $F_{osc}$, the component values for resistor $R_f$ 130*a* and capacitor $C_f$ 140*a* (RC filtering) can be less than the values of $R_f$ 130 and $C_f$ 140 from FIG. 1 since the voltage ripple on GATE_BOOST is at the same frequency as the VCO_CLK signal (as described in connection with FIG. 3).

As a result of the smaller $R_f$ 130*a* and $C_f$ 140*a* component values, the IC die area (if an integrated circuit) and cost for oscillatory system 10*a* is less than that of oscillatory system 10 of FIG. 1 while eliminating period peak to peak clock jitter in VCO 170*a* (and the corresponding VCO_CLK output signal).

In addition to the smaller $R_f$ 130*a* and $C_f$ 140*a* component values, the sensitivity of VCO 170*a* to VDD_REG ripple is less than what is required for VCO 170 of FIG. 1 because the periodic peak-to-peak jitter (shown in FIG. 3) is eliminated. However, VCO 170*a* sensitivity to VDD_REG may still be impacted by noise leakage from VDD_NOISY depending on LDO 20*a* isolation vs. frequency from VDD_NOISY to VDD_REG. The remainder of oscillatory system 10*a* may be otherwise similar to oscillatory system 10 of FIG. 1. In the same way, LDO 20*a* may be replaced with a switching voltage regulator and still eliminate VCO_CLK deterministic jitter in other exemplary embodiments not shown.

In accordance with the exemplary embodiments, LDO 20*a* may be utilized for digital, analog and radio frequency oscillator systems to eliminate the impact of period jitter and reduce phase noise from VDD_REG on VCO 170*a*. Low phase noise is required for many analog and radio frequency oscillator systems, particularly in high-speed digital designs (multi-GHz CPUs, digital communication links, and the like) as well as radio frequency analog designs (transmitters, receivers, signal generators, and the like). As described in FIG. 2, the power dissipation of capacitive voltage booster 120 will increase as the VCO 170*a* output frequency increases. However, improvements in integrated circuit process technology (smaller process geometry) will reduce the power dissipation of capacitive voltage booster 120 for high-speed digital clock and radio frequency designs in particular.

Additionally as described previously in reference to FIG. 1, LDO 20*a*, reference clock oscillator 30, clock generator 40*a* of FIG. 4 may be one or more circuit blocks. Each circuit block may be implemented as an integrated circuit (separate or combined) or as a combination of discrete electronic elements.

Figure 5:
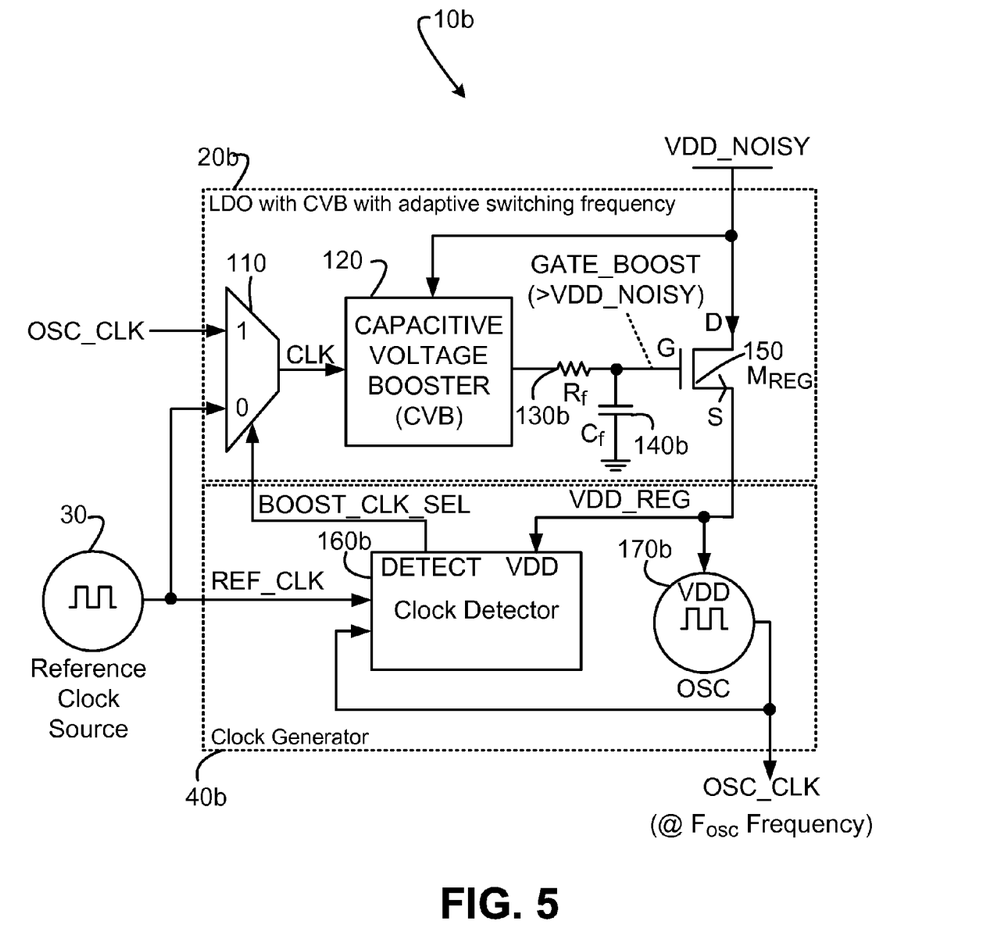
FIG. 5 shows a schematic diagram of an oscillatory system with a LDO, clock detector, and low-jitter oscillator in accordance with another exemplary embodiment.

FIG. 5 shows a schematic diagram of an oscillatory system 10*b* with a LDO, clock detector, and low-jitter oscillator in accordance with an alternate exemplary embodiment. Within oscillatory system 10*b*, LDO 20*b* regulates VDD_NOISY input voltage to generate a "clean" regulated output voltage signal, VDD_REG for clock generator 40*b*. VDD_REG is connected to a clock detector 160*b* and a noise sensitive low-jitter oscillator (OSC 170*b*) contained within clock generator 40*b*.

The main difference between FIG. 5 from FIG. 4 is that VCO 170*a* has been replaced with a low-jitter oscillator (OSC 170*b*) which generates a fixed output frequency signal, OSC_CLK.

OSC 170*b* may be any electronic oscillator without an external frequency control input (or requires PLL 160*a*). As a result, a clock detector 160*b* is utilized to generate the BOOST_CLK_SEL instead of the PLL 160*a* shown previously in FIG. 4. Clock detector 160*b* may be implemented with digital logic blocks including a multi-tap delay line, multiplexer, and latch clock inputs for a reference clock (REF_CLK) and a low-jitter clock source (CLK in FIG. 5) to be detected. Several possible implementations for clock detector 160*b* are described in "Building a Clock Fail Detector Using a Delay Line", Tech Brief 35, published by Dallas Semiconductor (now Maxim Semiconductor), Feb. 15, 2002.

In this alternate exemplary embodiment of oscillator system 10*b*, LDO 20*b* includes multiplexer (MUX) 110 (as described in reference to FIG. 4) for selecting a clock signal input, CLK, for capacitive voltage booster 120. At oscillatory system 10*b* startup (power-on), REF_CLK connects to the clock signal input, CLK, via MUX 110 and control signal BOOST_CLK_SEL (low when clock detector 160*b* DETECT signal is low). In this instance, clock detector 160*b* has not detected OSC_CLK toggling within a specified range of frequencies or at a stable frequency, and both the clock detector 160*b* DETECT signal and BOOST_CLK_SEL signal are active low. Once clock detector 160*b* has detected OSC_CLK at a stable desired frequency or within a range of frequencies, both clock detector 160b DETECT signal and BOOST_CLK_SEL are active high. Once BOOST_CLK_SEL is active high, OSC_CLK signal connects to the clock signal input, CLK via MUX 110.

As described in reference to FIG. 4, a key advantage of LDO 20b and clock generator 40b over LDO 20 and clock generator 40 (from FIG. 1) is the adaptive switching frequency for the clock input to the capacitive voltage booster 120. In the oscillatory system 10b of FIG. 5, the GATE_BOOST signal AC voltage component is still present (as described in reference to FIG. 1), but the switching frequency is changed to the OSC_CLK signal frequency, $F_{osc}$, when the clock detector 160b detects that OSC_CLK is at or within a range of the desired operating frequency. Therefore, according to FIG. 3, the period peak to peak jitter is zero (for OSC 170b and OSC_CLK output signal) when the noise frequency is equal to $F_{osc}$.

Because switching frequency, CLK, for capacitive voltage booster 120 is equal to $F_{osc}$, the component values for resistor $R_f$ 130b and capacitor $C_f$ 140b (RC filtering) can be less than $R_f$ 130 and $C_f$ 140 from FIG. 1. This is because the voltage ripple on GATE_BOOST is at the same frequency as the OSC_CLK signal (as described in reference to FIG. 3). As a result of the smaller $R_f$ 130b and $C_f$ 140b component values, IC die area and cost for oscillatory system 10b is less than that of oscillatory system 10 of FIG. 1 whilst also eliminating period clock jitter in OSC 170b (and the corresponding OSC_CLK output signal).

In addition to the smaller $R_f$ 130b and $C_f$ 140b component values, OSC 170b sensitivity to VDD_REG ripple is less than what is required for VCO 170 of FIG. 1. Again, this is because periodic peak-to-peak jitter (of FIG. 3) is eliminated. However, OSC 170b sensitivity to VDD_REG may still be impacted by noise leakage from VDD_NOISY depending on LDO 20a isolation vs. frequency from VDD_NOISY to VDD_REG. OSC 170b differs from VCO 170 and VCO 170a in that there is frequency tuning (no $V_{ctrl}$). The remainder of oscillatory system 10b is otherwise similar to oscillatory system 10 of FIG. 1 and the oscillatory system 10a of FIG. 4, and the same advantages of lower period peak to peak jitter apply to FIG. 5 as in FIG. 4. As described previously in reference to FIG. 4, LDO 20b may also be replaced with a switching voltage regulator and still eliminate OSC_CLK deterministic jitter.

Additionally as described previously in reference to FIG. 1 and FIG. 4, LDO 20b, reference clock oscillator 30, clock generator 40b of FIG. 5 may be one or more circuit blocks. Each circuit block may be implemented as an integrated circuit (separate or combined) or as a combination of discrete electronic elements.

Figure 6:
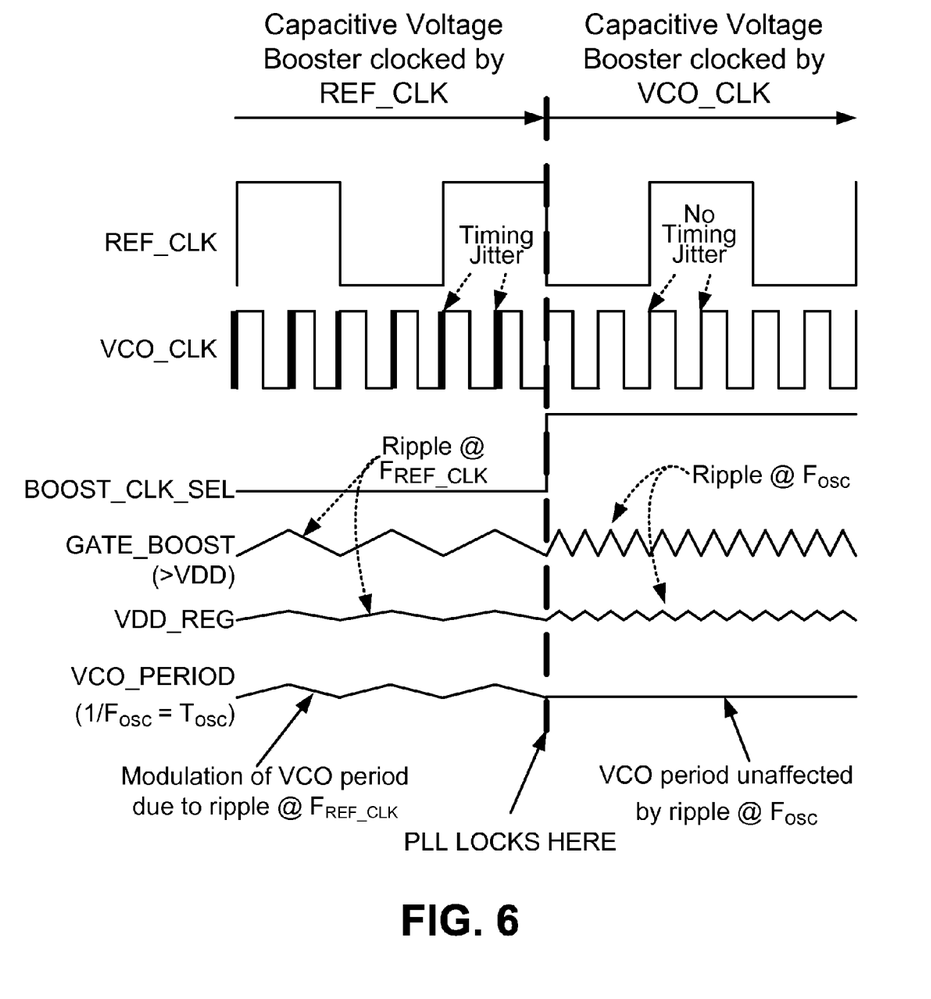
FIG. 6 shows timing relationship and signal characteristics for REF_CLK, VCO_CLK, BOOST_CLK_SEL, GATE_BOOST, VDD_REG, and VCO_PERIOD for the oscillatory system in FIG. 4.

FIG. 6 shows a plot of relevant signals (REF_CLK, VCO_CLK, BOOST_CLK_SEL, GATE_BOOST, VDD_REG, and VCO_PERIOD) from FIG. 4 in accordance with an exemplary embodiment. As is evident in FIG. 6, initially there is AC ripple on the GATE_BOOST signal at a frequency equal to REF_CLK frequency, $F_{REF\_CLK}$. This ripple is generated by capacitive voltage booster 120. The GATE_BOOST signal ripple introduces voltage ripple on VDD_REG which introduces period or timing jitter on the VCO_CLK signal.

Once PLL 160a has locked VCO 170a to a desired frequency, the BOOST_CLK_SEL signal transitions from a low to a high logic level and the AC ripple from the capacitive voltage booster 120 on the GATE_BOOST signal is at a frequency equal to VCO_CLK frequency, $F_{osc}$. In this instance, the GATE_BOOST signal ripple and VDD_REG voltage ripple is at the $F_{osc}$ frequency and there is zero period or timing jitter on the corresponding VCO_CLK signal. As a result, the VCO_CLK signal is "clean", despite the presence of AC ripple on VDD_REG.

A similar plot (not shown) for the oscillatory system 10b of FIG. 5 is not shown, however, the same principle of adaptively altering the switching frequency of capacitive voltage booster 120 applies to both oscillatory systems 10a and 10b from FIG. 4 and FIG. 5 respectively. However, the VCO_CLK and VCO_PERIOD signals would be replaced with OSC_CLK and OSC_PERIOD signals, respectively, and the source for BOOST_CLK_SEL signal changes from PLL 160a LOCK signal to clock detector 160b DETECT signal.

Figure 7:
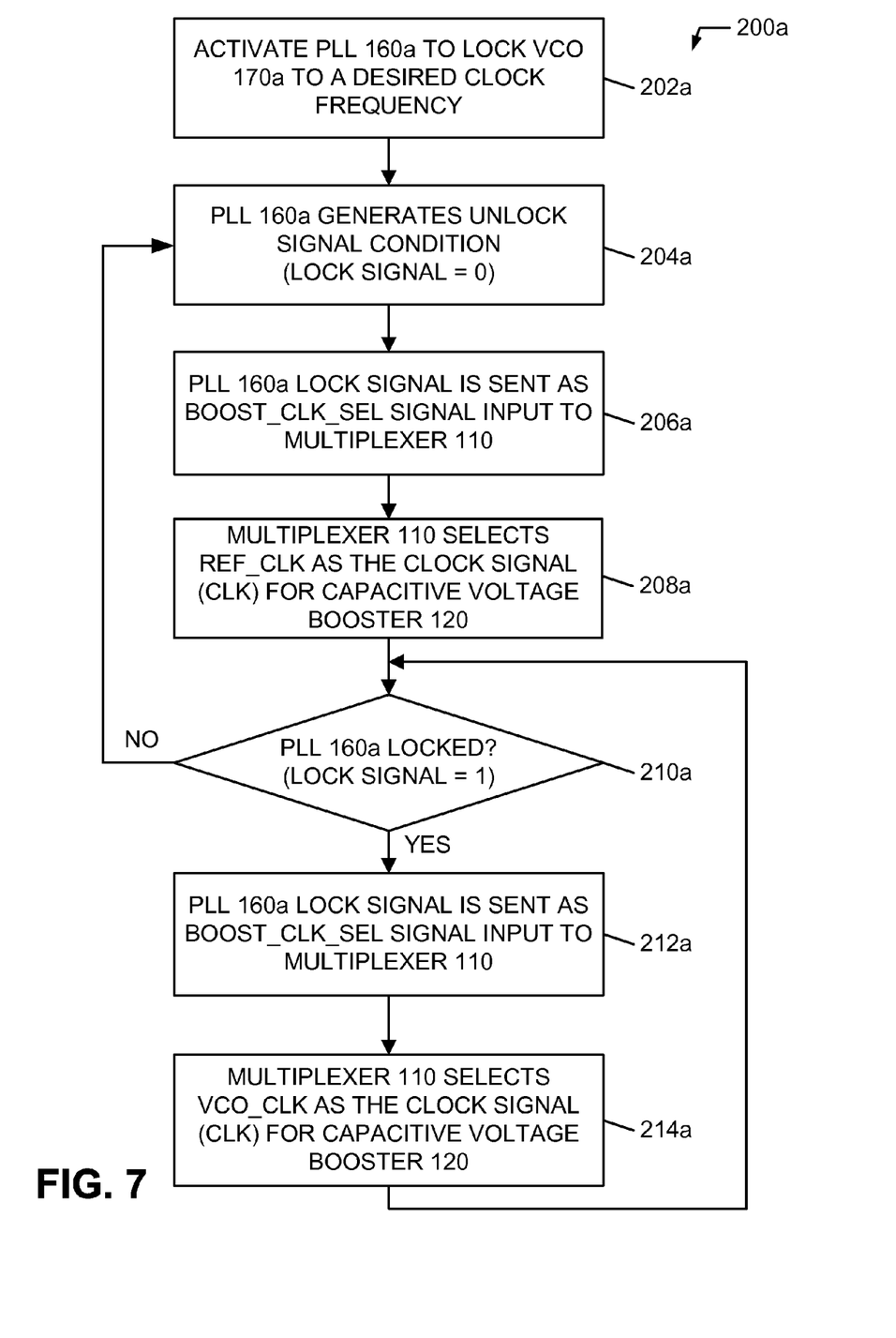
FIG. 7 is an operational flow diagram of the process of selecting a clock frequency for a LDO utilizing a capacitive voltage booster of FIG. 4

FIG. 7 is an operational flow diagram of the process of selecting a clock frequency for a LDO utilizing a capacitive voltage booster of FIG. 4 in accordance with an exemplary embodiment.

Operational flow diagram 200a starts with activating PLL 160a to lock VCO 170a to a desired clock frequency (block 202a) followed by PLL 160a generating an unlocked signal condition (LOCK signal=0) (block 204a). PLL 160a lock signal is sent as a BOOST_CLK_SEL signal input to multiplexer 110 (block 206a) followed by multiplexer 110 selecting REF_CLK as the clock signal input (CLK) for capacitive voltage booster 120 (block 208a). Once PLL 160a has locked VCO 170a to the desired frequency, PLL 160a generates a locked signal condition (LOCK signal=1) (block 210a). The PLL 160a lock signal is sent as a BOOST_CLK_SEL signal input to multiplexer 110 (block 212a) followed by multiplexer 110 selecting VCO_CLK as the clock signal input (CLK) for capacitive voltage booster 120 (block 214a). If PLL 160a ever generates an unlocked signal condition (LOCK signal=0), operational flow diagram 200a restarts (at block 204a).

Figure 8:
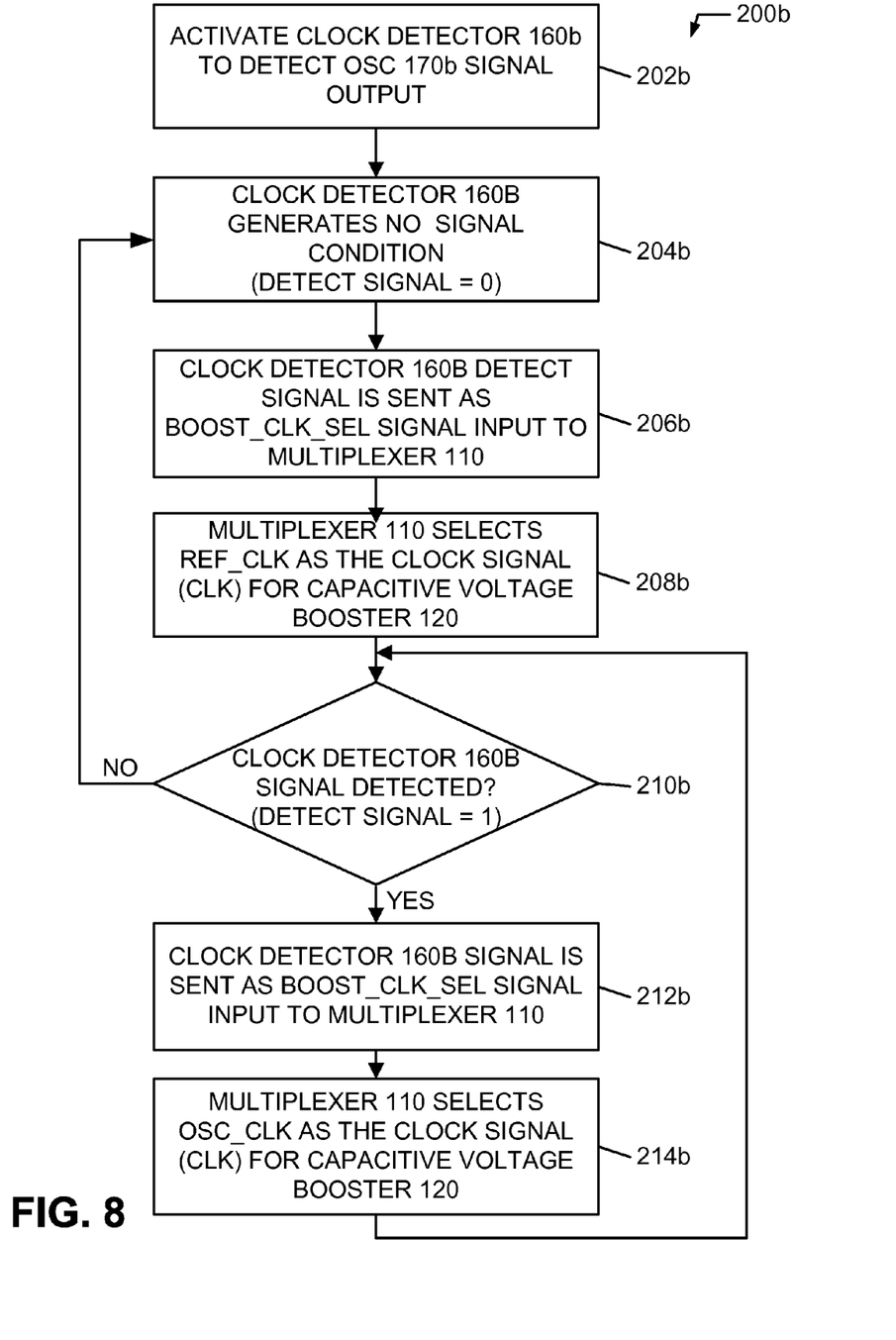
FIG. 8 is an operational flow diagram of the process of selecting a clock frequency for a clock detector-low-jitter oscillator system utilizing a LDO with a capacitive voltage booster of FIG. 5 To facilitate understanding, identical reference numerals have been used where possible to designate identical elements that are common to the figures, except that suffixes may be added, when appropriate, to differentiate such elements. The images in the drawings are simplified for illustrative purposes and are not necessarily depicted to scale.

FIG. 8 is an operational flow diagram of the process of selecting a clock frequency for a clock detector-low-jitter oscillator system utilizing a LDO with a capacitive voltage booster of FIG. 5 in accordance with an alternate exemplary embodiment.

Operational flow diagram 200b starts with activating clock detector 160b to detect OSC 170b signal output (block 202b) followed by clock detector 160b generating an no signal condition (DETECT signal=0) (block 204b). The clock detector 160b detect signal is sent as a BOOST_CLK_SEL signal input to multiplexer 110 (block 206b) followed by multiplexer 110 selecting REF_CLK as the clock signal input (CLK) for capacitive voltage booster 120 (block 208b). Once clock detector 160b detects an output signal frequency from OSC 170b, clock detector 160b generates a detect signal condition (DETECT signal=1) (block 210b). Clock detector 160b detect signal is sent as a BOOST_CLK_SEL signal input to multiplexer 110 (block 212b) followed by multiplexer 110 selecting OSC_CLK as the clock signal input (CLK) for capacitive voltage booster 120 (block 214b). When clock detector 160b ever generates the no signal condition (DETECT signal=0), operational flow diagram 200b restarts (at block 204b).

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method of operating a power supply operable at a configurable switching frequency for a low-jitter oscillatory system, comprising:
   identifying a state of a clock detector control signal; and
   adaptively selecting the configurable switching frequency for the power supply between a reference clock oscillator output signal and a low-jitter oscillatory system output signal based on the state of the clock detector control signal to mitigate effects of period jitter in the low-jitter oscillatory system output signal when the clock detector control signal is asserted.

2. The method of claim 1, wherein the state of the clock detector control signal is further configured for selecting the reference clock oscillator output signal as the clock signal input to the power supply when the low-jitter oscillatory system output frequency is not stable.

3. The method of claim 2, wherein the state of the clock detector control signal is further configured for selecting the low-jitter oscillatory system output signal as the clock signal input to the power supply when the low-jitter oscillatory system output frequency is stable.

4. The method of claim 3, wherein the state of the clock detector control signal is further configured for selecting the reference clock oscillator output signal as the clock signal input to the power supply when the low-jitter oscillatory system is initially powered-on.

5. A device for operating a power supply operable at a configurable switching frequency for a low-jitter oscillatory system, comprising:
   means for identifying a state of a clock detector control signal; and
   means for adaptively selecting the switching frequency for the power supply between a reference clock oscillator output signal and a low-jitter oscillatory system output signal based on the state of the clock detector control signal to mitigate effects of period jitter in the low-jitter oscillatory system output signal when a clock detector control signal is asserted.

6. The device of claim 5, wherein the means for identifying the state of the clock detector control signal is further configured for selecting the reference clock oscillator output signal as the clock signal input to the power supply when the oscillatory system output frequency is not stable.

7. The device of claim 6, wherein the means for identifying the state of the clock detector control signal is further configured for selecting the oscillatory system output signal as the clock signal input to the power supply when the oscillatory system output frequency is stable.

8. The device of claim 7, wherein the means for identifying the state of the clock detector control signal is further configured for selecting the reference clock oscillator output signal as the clock signal input to the power supply when the oscillatory system is initially powered-on.

9. A computer program product, comprising computer readable storage medium, comprising instructions when executed by a computer for causing a low-jitter oscillatory system with a power supply operable at a configurable switching frequency to:
identify a state of a clock detector control signal; and
adaptively select the configurable switching frequency for the power supply between a reference clock oscillator output signal and the low-jitter oscillatory system output signal based on the state of the clock detector control signal to mitigate effects of period jitter in the low-jitter oscillatory system output signal when the clock detector control signal is asserted.

10. The computer program product of claim 9, wherein the instruction to identify the state of the clock detector control signal involves selecting the reference clock oscillator output signal as the clock signal input to the power supply when the low-jitter oscillatory system output frequency is not stable.

11. The computer program product of claim 10, wherein the instruction to identify the state of the clock detector control signal further involves selecting the low-jitter oscillatory system output signal as the clock signal input to the power supply when the low-jitter oscillatory system output frequency is stable.

12. The computer program product of claim 11, wherein the instruction to identify the state of the clock detector control signal further involves selecting the reference clock oscillator output signal as the clock signal input to the power supply when the low-jitter oscillatory system is initially powered-on.

13. A device comprising:
a reference clock oscillator;
a low-jitter oscillator;
a power supply including a clock signal input to regulate a power supply voltage for the low-jitter oscillator;
a clock detector to generate a clock detector control signal when a low-jitter oscillator output signal frequency is stable; and
a multiplexer to select between a reference clock oscillator output signal and the low-jitter oscillator output signal as the clock signal input to the power supply to mitigate effects of period jitter in the low-jitter oscillator output signal when the clock detector control signal is asserted.

14. The device of claim 13, wherein the clock detector control signal is further configured to control the multiplexer to select the reference clock oscillator output signal as the clock signal input to the power supply when the low-jitter oscillator output frequency is not stable.

15. The device of claim 13, wherein the clock detector control signal is further configured to control the multiplexer to select the low-jitter oscillator output signal as the clock signal input to the power supply when the low-jitter oscillator output frequency is stable.

16. The device of claim 15, wherein the clock detector control signal is further configured to control the multiplexer to select the reference clock oscillator output signal as the clock signal input to the power supply when the low-jitter oscillator is initially powered-on.

17. The device of claim 13, wherein the device is an integrated circuit.

18. A device including an oscillatory system comprising:
a reference clock oscillator;
a low-jitter oscillator;
a switching power supply to regulate a power supply voltage for the low-jitter oscillator;
a clock detector to generate a clock detector control signal when a low-jitter oscillator output frequency is stable; and
a multiplexer to select between a reference clock oscillator output signal and the low-jitter oscillator output signal as a clock signal input to the power supply to mitigate effects of period jitter in the low-jitter oscillator output signal when the clock detector control signal is asserted.

19. The device of claim 18, wherein the clock detector control signal is further configured to control the multiplexer to select the reference clock oscillator output signal as the clock signal input to the power supply when the low-jitter oscillator output frequency is not stable.

20. The device of claim 18, wherein the clock detector control signal is further configured to control the multiplexer to select the low-jitter oscillator output signal as the clock signal input to the power supply when the low-jitter oscillator output frequency is stable.

21. The device of claim 20, wherein the clock detector control signal is further configured to control the multiplexer to select the reference clock oscillator output signal as the clock signal input to the power supply when the low-jitter oscillator is initially powered-on.

22. The device of claim 18, wherein the device is an integrated circuit.

23. A device comprising:
a reference clock oscillator;
a voltage-controlled oscillator (VCO);
a phase locked loop (PLL) to generate a control voltage to lock the VCO to a desired operating frequency and provide a PLL lock signal;
a NMOS transistor to regulate a power supply voltage for the VCO in relation to a common power supply voltage;
a capacitive voltage booster to generate a GATE_BOOST signal voltage for a gate node of the NMOS transistor; and
a multiplexer to select between a reference clock oscillator output signal and a VCO output signal as a clock signal input to the capacitive voltage booster to mitigate effects of period jitter when the PLL lock signal is asserted.

24. The device of claim 23, wherein the PLL lock signal is further configured to control the multiplexer to select the VCO output signal as the clock signal input to the capacitive voltage booster when the PLL and VCO are locked to a desired operating frequency.

25. The device of claim 24, wherein the PLL lock signal is further configured to control the multiplexer to select the reference clock oscillator output signal as the clock signal input to the capacitive voltage booster when the PLL and VCO are not locked to a desired operating frequency.

26. The device of claim 25, wherein the PLL lock signal is further configured to control the multiplexer to select the reference clock oscillator output signal as the clock signal input to the capacitive voltage booster when the PLL and VCO are initially powered-on.

27. The device of claim 23, wherein the device is an integrated circuit.

28. A device including an oscillatory system comprising:
a reference clock oscillator;
a voltage-controlled oscillator (VCO);
a phase locked loop (PLL) to generate a control voltage to lock the VCO to a desired operating frequency and provide a PLL lock signal;

a NMOS transistor to regulate a power supply voltage for the VCO in relation to a common power supply voltage;

a capacitive voltage booster to generate a GATE_BOOST signal voltage for a gate node of the NMOS transistor; and a multiplexer to select between a reference clock oscillator output signal and a VCO output signal as a clock signal input to the capacitive voltage booster to mitigate effects of period jitter when the PLL lock signal is asserted.

29. The device of claim 28, wherein the PLL lock signal is further configured to control the multiplexer to select the VCO output signal as the clock signal input to the capacitive voltage booster when the PLL and VCO are locked to a desired operating frequency.

30. The device of claim 29, wherein the PLL lock signal is further configured to control the multiplexer to select the reference clock oscillator output signal as the clock signal input to the capacitive voltage booster when the PLL and VCO are not locked to a desired operating frequency.

31. The device of claim 30, wherein the PLL lock signal is further configured to control the multiplexer to select the reference clock oscillator output signal as the clock signal input to the capacitive voltage booster when the PLL and VCO are initially powered-on.

32. The device of claim 28, wherein the device is an integrated circuit.

* * * * *